(12) United States Patent
Noh (10) Patent No.: US 9,997,709 B2
(45) Date of Patent: Jun. 12, 2018

(54) METHOD FOR MANUFACTURING TRANSISTOR ACCORDING TO SELECTIVE PRINTING OF DOPANT

(71) Applicant: DONGGUK UNIVERSITY INDUSTRY-ACADEMIC COOPERATION FOUNDATION, Seoul (KR)

(72) Inventor: Yong Young Noh, Daejeon (KR)

(73) Assignee: DONGGUK UNIVERSITY INDUSTRY-ACADEMIC COOPERATION FOUNDATION, Seoul (KR)

(*) Notice: Subject to any disclaimer, the term of this patent is extended or adjusted under 35 U.S.C. 154(b) by 0 days. days.

(21) Appl. No.: 15/320,750

(22) PCT Filed: Jul. 14, 2015

(86) PCT No.: PCT/KR2015/007283
§ 371 (c)(1),
(2) Date: Dec. 20, 2016

(87) PCT Pub. No.: WO2016/010332
PCT Pub. Date: Jan. 21, 2016

(65) Prior Publication Data
US 2017/0200889 A1 Jul. 13, 2017

(30) Foreign Application Priority Data

Jul. 17, 2014 (KR) .................. 10-2014-0090254

(51) Int. Cl.
*H01L 51/00* (2006.01)
*H01L 21/04* (2006.01)
(Continued)

(52) U.S. Cl.
CPC .......... *H01L 51/002* (2013.01); *H01L 21/041* (2013.01); *H01L 21/38* (2013.01); *H01L 29/66045* (2013.01); *H01L 29/66969* (2013.01); *H01L 51/0005* (2013.01); *H01L 29/1606* (2013.01); *H01L 29/227* (2013.01);
(Continued)

(58) Field of Classification Search
CPC ............ H01L 51/0043; H01L 51/0036; H01L 51/0545; H01L 51/0558; H01L 51/0541; H01L 51/0072; H01L 51/054
See application file for complete search history.

(56) References Cited

FOREIGN PATENT DOCUMENTS

JP H11-251259 A 9/1999
KR 10-2012-0071625 A 7/2012
(Continued)

OTHER PUBLICATIONS

Korean Patent No. 1020120071625 [Machine's translation].*
None Patent Literature Giorgio Dell'Erba et al. [Organic integrated circuits . . . charge injection engineering.].*
International Search Report in International Application No. PCT/KR2015/007283, dated Sep. 17, 2015.
(Continued)

*Primary Examiner* — Tony Tran
(74) *Attorney, Agent, or Firm* — Park, Kim & Suh, llc (57) ABSTRACT

The present invention relates to a method for manufacturing a transistor according selective printing of a dopant. For the manufacture of a transistor, a semiconductor layer is formed on a substrate, and a dopant layer is formed on the semiconductor layer. In the formation of the dopant layer, an inkjet printing is used to selectively print an n type dopant or a p type dopant.

6 Claims, 8 Drawing Sheets

(51) Int. Cl.
*H01L 21/38* (2006.01)
*H01L 29/66* (2006.01)
*H01L 51/05* (2006.01)
*H01L 29/16* (2006.01)
*H01L 29/227* (2006.01)
*H01L 29/24* (2006.01)
*H01L 29/786* (2006.01)

(52) U.S. Cl.
CPC .......... *H01L 29/24* (2013.01); *H01L 29/7869* (2013.01); *H01L 29/78684* (2013.01); *H01L 51/0541* (2013.01); *H01L 51/0558* (2013.01)

(56) References Cited

FOREIGN PATENT DOCUMENTS

KR  10-2012-0100241 A  9/2012
KR     10-1218925 B1  1/2013

OTHER PUBLICATIONS

Dell'Erba, Giorgio et al., Organic Integrated Circuits for Information Storage Based on Ambipolar Polymers and Charge Injection Engineering, Applied Physics Letters, Apr. 2014, vol. 104, No. 15, pp. 153303-1-153303-5.

* cited by examiner

FIG. 8

METHOD FOR MANUFACTURING TRANSISTOR ACCORDING TO SELECTIVE PRINTING OF DOPANT

CROSS-REFERENCE TO RELATED APPLICATIONS

This application is the National Stage filing under 35 U.S.C. 371 of International Application No. PCT/KR2015/007283, filed on Jul. 14, 2015, which claims the benefit of Korean Patent Application No. 10-2014-0090254, filed on Jul. 17, 2014, the contents of which are all hereby incorporated by reference herein in their entirety.

TECHNICAL FIELD

The present invention relates to a method for manufacturing a transistor according to the selective printing of a dopant, and more particularly, to a method for manufacturing a transistor according to the selective printing of a dopant to form a dopant layer on a semiconductor layer.

BACKGROUND ART

Recent years, flexible displays are receiving quite a bit of attention. The demand for flexible displays that are foldable, bendable or rollable is being driven due to the customers' desire for larger portable displays. Further, the solution process and the roll-to-roll process, if available, can make it possible to produce such flexible displays at lower cost. At this point, the requirement is the use of a substrate as flexible as plastic or stainless steel, which requires the lower processing temperature of 300° C. or below. Many researches have recently been devoted to the organic thin film transistor (OTFT) as a transistor for driver circuit that can be produced at such a low temperature.

For the sake of high definition and low-power driving, an active matrix (AM) driving method is necessary. The inorganic transistor like silicone, currently available, is fabricated at high temperature and liable to breakage when bent or stretched, so there is a limit to apply the inorganic transistor to flexible and stretchable displays. Further, the solution process is impossible to use, resulting in the limitation to use in combination with another substances. Therefore, there are many researches in progress on the organic thin film transistors (OTFTs) that are easily fabricated at low temperature, available to the solution process and resistant to bending.

The organic thin film transistor, as a driving device for next-generation display, has been actively studied and expected to use in the fabrication of radio frequency identification (RFID) tags that are applicable to the recognition of individual item units. The organic thin film transistor, using an organic semiconductor film rather than a silicone film as a semiconductor layer, can be classified according to the material of the organic film into a low-molecular organic thin film transistor, such as an oligothiophene- or pentacene-based organic thin film transistor, and a high-molecular organic thin film transistor, such as a polythiophene-based organic thin film transistor.

On the other hand, a process for injecting a dopant is carried out on the semiconductor layer of the thin film transistor. The conventional methods related to the dopant injection process involve deposition of a dopant on an organic semiconductor thin film in a high-vacuum chamber by the vacuum-based thermal deposition technique or application of a dopant in the form of a solution on an organic semiconductor thin film by the spin coating process.

Many research organizations are making studies on the techniques for doping a semiconductor using a dopant for semiconductor, most of which techniques involve applying a dopant on an organic semiconductor thin film in a high-vacuum chamber by deposition or applying a dopant in the form of a solution on an organic semiconductor thin film by spin coating.

Accordingly, there is the difficulty in the technical injection of different dopants when semiconductors of different properties are formed on the substrate.

DISCLOSURE OF INVENTION

It is an object of the present invention to provide a method for manufacturing a transistor that is capable of selective printing of a dopant on a semiconductor layer in the transistor.

It is another object of the present invention to provide a method for manufacturing a transistor that provides a stabilized device.

It is further another object of the present invention to provide a method for manufacturing a transistor that includes selectively printing a dopant in a specific region of a semiconductor layer in the transistor to enhance the performance of the device.

TECHNICAL SOLUTION

In order to achieve the objects of the present invention, there is provided a method for manufacturing a transistor according to selective printing of a dopant, the method comprising: forming a semiconductor layer on a substrate for manufacture of a transistor; and forming a dopant layer on the semiconductor layer, where the formation of the dopant layer includes selectively printing an n type dopant or a p type dopant by inkjet printing.

In the present invention, the n type dopant comprises at least one selected from the group consisting of cesium fluoride (CsF), bis(ethylenedithio)-tetrathiafulvalence (BEDT-TTF), tetrathianaphthacene (TTN), bis(cyclopentadienyl)-cobalt(II) ($CoCp_2$), chromium with the anion of 1,3,4,6,7,8-hexahydro-2H-pyrimido[1,2-a]pyrimidine (hpp) ($Cr_2(hpp)_4$), tungsten with the anion of 1,3,4,6,7,8-hexahydro-2H-pyrimido[1,2-a]pyrimidine (hpp) ($W_2(hpp)_4$), pyronin B chloride, acridine orange base [3,6-bis(dimethylamino)acridine (AOB)], leuco bases like leuco crystal violet (LCV), (4-(1,3-dimethyl-2,3-dihydro-1H-benzoimidazol-2yl)phenyl)dimethylamine (nDMBI), and 2-(2-methoxyphenyl)-1,3-dimethyl-1H-benzoimidazol-3-ium iodide (o-MeO-DMBI-I). The p type dopant of the present invention comprises at least one selected from the group consisting of 2,3,5,6-tetrafluoro-7,7,8,8-tetracyanoquinodimethane ($F_4$-TCNQ), 3,6-difluoro-2,5,7,7,8,8-hexacyanoquinodimethane ($F_2$—HCNQ), molybdenum trioxide ($MoO_3$), and tungsten trioxide ($WO_3$).

In the present invention, the n type dopant or the p type dopant is dissolved in a solvent and used in inkjet printing, where the solvent comprises any one selected from the group consisting of chlorobenzene, chloroform, trichlorobenzene, tetrahydrofuran, dichlorobenzene, and dichloroethane.

In the present invention, the amount of the dopant contained in a portion of the semiconductor layer containing the dopant is 0.5 wt. % to 1.0 wt. %.

The present invention also provides a method for manufacturing a transistor that comprises: preparing a substrate; forming a source/drain electrode on the substrate; forming a semiconductor layer on the source/drain electrode; forming a dopant layer on the semiconductor layer; forming an insulating layer on the semiconductor layer; and forming a gate electrode on the insulating layer. At this point, the formation of the dopant layer is performed by selectively printing a dopant on the semiconductor layer by inkjet printing.

In the present invention, the n type dopant comprises at least one selected from the group consisting of cesium fluoride (CsF), bis(ethylenedithio)-tetrathiafulvalence (BEDT-TTF), tetrathianaphthacene (TTN), bis(cyclopentadienyl)-cobalt(II) (CoCp$_2$), chromium with the anion of 1,3,4,6,7,8-hexahydro-2H-pyrimido[1,2-a]pyrimidine (hpp) (Cr$_2$(hpp)$_4$), tungsten with the anion of 1,3,4,6,7,8-hexahydro-2H-pyrimido[1,2-a]pyrimidine (hpp) (W$_2$(hpp)$_4$), pyronin B chloride, acridine orange base [3,6-bis(dimethylamino)acridine (AOB)], leuco bases like leuco crystal violet (LCV), (4-(1,3-dimethyl-2,3-dihydro-1H-benzoimidazol-2yl)phenyl)dimethylamine (nDMBI), and 2-(2-methoxyphenyl)-1,3-dimethyl-1H-benzoimidazol-3-ium iodide (o-MeO-DMBI-I). The p type dopant comprises at least one selected from the group consisting of 2,3,5,6-tetrafluoro-7,7,8,8-tetracyanoquinodimethane (F$_4$-TCNQ), 3,6-difluoro-2,5,7,7,8,8-hexacyanoquinodimethane (F$_2$—HCNQ), molybdenum trioxide (MoO$_3$), and tungsten trioxide (WO$_3$).

In the present invention, the n type dopant or the p type dopant is dissolved in a solvent and used in inkjet printing, where the solvent comprises any one selected from the group consisting of chlorobenzene, chloroform, trichlorobenzene, tetrahydrofuran, dichlorobenzene, and dichloroethane.

In the present invention, the amount of the dopant contained in a portion of the semiconductor layer containing the dopant is 0.5 wt. % to 1.0 wt. %.

In the present invention, the semiconductor layer comprises any one selected from the group consisting of an organic semiconductor, a metal oxide semiconductor and a carbon compound semiconductor.

In the present invention, the organic semiconductor comprises any one selected from the group consisting of an amphiphilic organic semiconductor, an n type organic semiconductor and a p type organic semiconductor. The amphiphilic organic semiconductor is any one selected from the group consisting of [6,6-phenyl-C$_{61}$-butyric acid methyl ester (PCBM), naphthalene-bis(dicarboximide)bithiophene (P(NDI$_2$OD-T$_2$)), poly[(9,9-di-n-octylfluorenyl-2,7-diyl)-alt-(benzo[2,1,3]thiadiazol-4,8-diyl)] (F$_8$BT), poly(9,9-di-octylfluorene) (PFO), diketopyrrolo-pyrrole-bithiophene (DPPT-TT), and poly(thienylenevinylene-cophthalimide) (PTVPhI-Eh) functionalized with dodecyl at the imide nitrogen. The n type organic semiconductor is any one selected from a substance based on acene, fully fluorinated acene, partially fluorinated acene, partially fluorinated oligothiophene, fullerene, fullerene with a substituent, fully fluorinated phthalocyanine, partially fluorinated phthalocyanine, perylene tetracarboxylic diimide, perylene tetracarboxylic dianhydride, naphthalene tetracarboxylic diimide, or naphthalene tetracarboxylic dianhydride, or a derivative thereof. The P type organic semiconductor is any one selected from a substance including acene, poly-thienylene vinylene, poly-3-hexylthiophene, alpha-hexathienylene, naphthalene, alpha-6-thiophene, alpha-4-thiophene, rubrene, polythiophene, polyparaphenylene vinylene, polyparaphenylene, polyfluorene, polythiophene vinylene, polythiophene-heterocyclic aromatic copolymer, or triaryl amine, or a derivative thereof.

In the present invention, the metal oxide semiconductor is any one selected from the group consisting of zinc oxide (ZnO$_x$), indium oxide (InO$_x$), indium gallium zinc oxide (IGZO), and indium tin oxide (ITO).

In the present invention, the carbon compound semiconductor is selected from carbon nanotube (CNT) or graphene nano-ribbon.

ADVANTAGEOUS EFFECTS

The method for manufacturing a transistor according to selective printing of a dopant in the present invention enables selectively printing a dopant in a desired region by inkjet printing rather than applying a dopant all over the region, and achieves a selective doping in an actual channel region out of the semiconductor layer of the OTFTs.

The method for manufacturing a transistor according to selective printing of a dopant in the present invention can enhance the performance of the device by performing a selectively doping in a specific region of the semiconductor layer in the transistor.

BEST MODES FOR CARRYING OUT THE PRESENT INVENTION

Hereinafter, the present invention will be described in detail with reference to the accompanying drawings. Reference should be made to the drawings, in which the same reference numerals are used throughout the different drawings to designate the same or similar components as possible. Further, in the following description of the present invention, a detailed description of known configurations and functions incorporated herein will be omitted when it may make the subject matter of the present invention rather unclear.

The term "about or approximately" or "substantially" used in this specification are intended to have meanings close to numerical values or ranges specified with an allowable error and to prevent accurate or absolute numerical values disclosed for understanding of the present invention from being illegally or unfairly used by any unconscionable third party.

The transistor of the present invention is described in association with the top gate bottom contact (TGBC) structure, but it can be applied to the bottom gate top contact (BGTC) structure as well.

Figure 1:
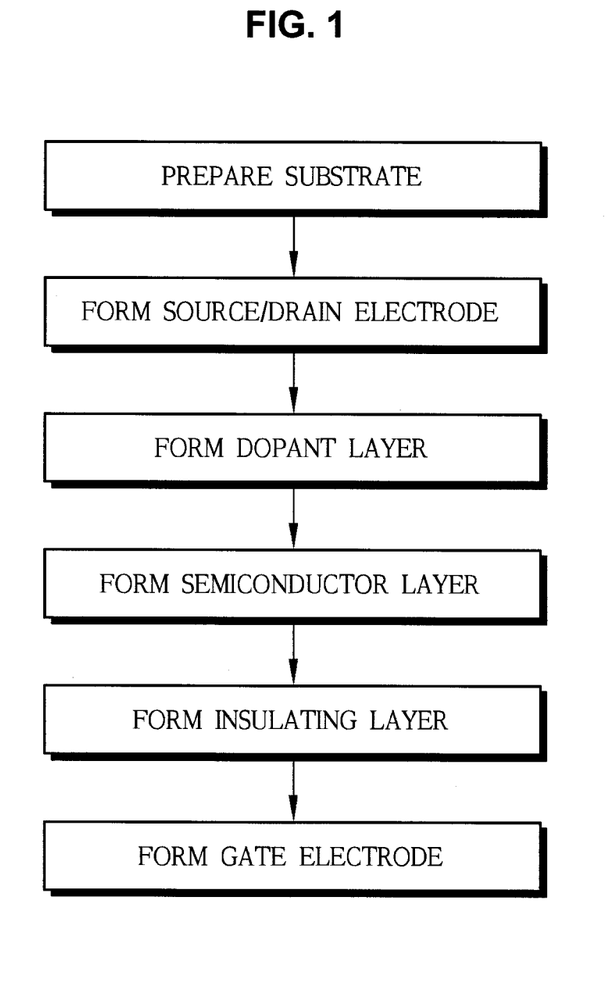
FIGS. 1 and 2 are diagrams showing a process for manufacturing a transistor according to one embodiment of the present invention.
Figure 2:
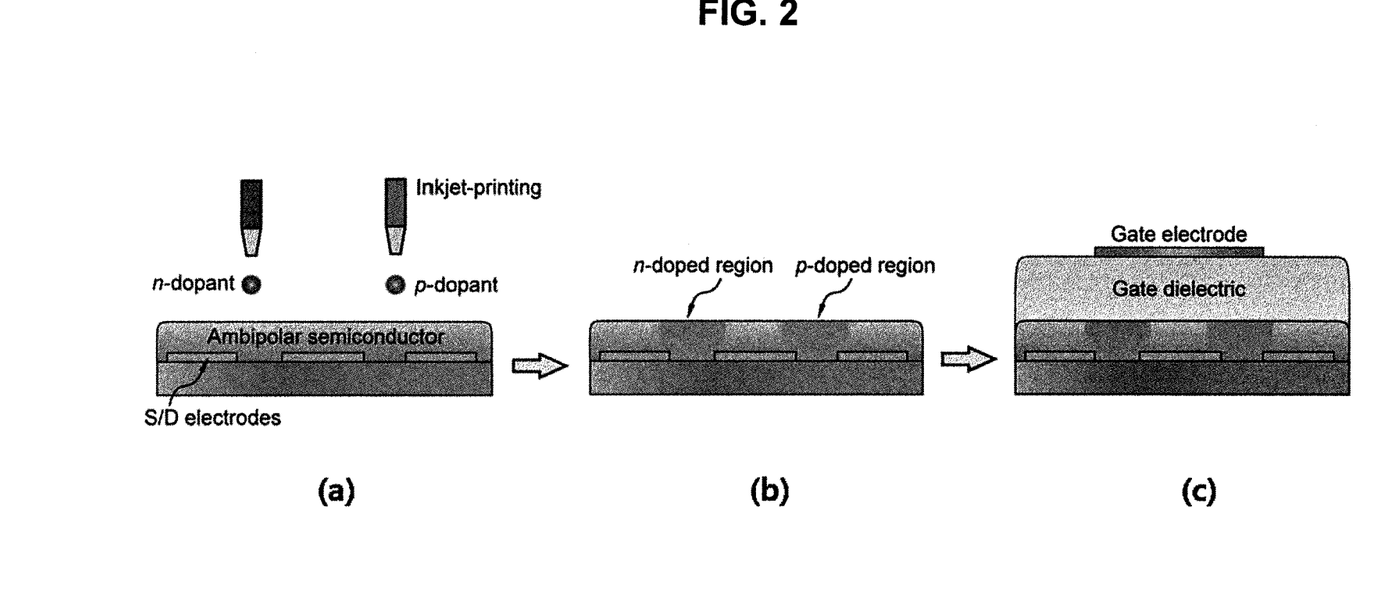

FIGS. 1 and 2 are diagrams showing a process for manufacturing a transistor according to one embodiment of the present invention.

A top gate type transistor is manufactured in the steps of preparing a substrate; forming source/drain electrodes to be disposed apart from each other on the substrate; forming a semiconductor layer to cover the source/drain electrodes; forming a dopant layer on the semiconductor layer; forming an insulating layer on the dopant layer; and forming a gate electrode in a partial region on the insulating layer.

The transistor of the present invention may be used for the CMOS inverter device comprising both n type and p type semiconductors.

Referring to FIG. 1, a substrate is provided, and source/drain electrodes are formed on the substrate so that they are disposed apart from each other.

The substrate may include a transparent substrate like glass, or a flexible substrate, such as a silicone substrate, a plastic substrate or a metal foil substrate. Examples of the plastic substrate as used herein may include polyether sulphone, polyacrylate, polyether imide, polyethylene naphthalate, polyethylene terephthalate, polyphenylene sulfide, polyallylate, polyimide, polycarbonate, cellulose triacetate, cellulose acetate propionate, etc.

The source/drain electrodes may be formed as a single layer selected from Au, Al, Ag, Mg, Ca, Yb, Cs-ITO, or alloy thereof; or as a multi-layer that further includes an adhesive metal layer like Ti, Cr or Ni in order to enhance the adhesion to the substrate. Moreover, graphene, carbon nanotube (CNT), PEDOT:PSS conductive polymer, silver nanowire, etc. can be used to manufacture a device having much higher elasticity than the existing metals. These substances can also be used as an ink for the printing process like ink-jet printing or spraying to make source/drain electrodes. Using the printing process to form source/drain electrodes enables it to exclude the vacuuming process, ending up reducing the production cost.

On the source/drain electrodes may be formed a semiconductor layer. The semiconductor layer may comprise any one selected from an organic semiconductor, a metal oxide semiconductor, and a carbon compound semiconductor.

The organic semiconductor as used herein may be an amphiphilic organic semiconductor, an n type organic semiconductor, or a p type organic semiconductor.

The amphiphilic organic semiconductor as used herein may be any one selected from the group consisting of [6,6-phenyl-$C_{61}$-butyric acid methyl ester (PCBM), naphthalene-bis(dicarboximide)bithiophene (P(NDI$_2$OD-T$_2$)), poly[(9,9-di-n-octylfluorenyl-2,7-diyl)-alt-(benzo[2,1,3] thiadiazol-4,8-diyl)] (F$_8$BT), poly(9,9-dioctylfluorene) (PFO), diketopyrrolo-pyrrole-bithiophene (DPPT-TT), and poly(thienylenevinylene-cophthalimide) (PTVPhI-Eh) functionalized with dodecyl at the imide nitrogen.

The n type organic semiconductor as used herein may be any one selected from the substances based on acene, fully fluorinated acene, partially fluorinated acene, partially fluorinated oligothiophene, fullerene, fullerene with a substituent, fully fluorinated phthalocyanine, partially fluorinated phthalocyanine, perylene tetracarboxylic diimide, perylene tetracarboxylic dianhydride, naphthalene tetracarboxylic diimide, or naphthalene tetracarboxylic dianhydride. In this regard, the acene-based substance may be selected from anthracene, tetracene, pentacene, perylene, or coronene.

Further, the p type organic semiconductor as used herein may be selected from a substance including acene, polythienylene vinylene, poly-3-hexylthiophene, alpha-hexathienylene, naphthalene, alpha-6-thiophene, alpha-4-thiophene, rubrene, polythiophene, polyparaphenylene vinylene, polyparaphenylene, polyfluorene, polythiophene vinylene, polythiophene-heterocyclic aromatic copolymer, or triaryl amine, or a derivative thereof. In this regard, the acene-based substance is any one of pentacene, perylene, tetracene, or anthracene.

Further, the metal oxide semiconductor as used herein may be any one selected from the group consisting of zinc oxide (ZnO$_x$), indium oxide (InO$_x$), indium gallium zinc oxide (IGZO), and indium tin oxide (ITO).

Further, the carbon compound semiconductor as used herein may be selected from carbon nanotube (CNT) or graphene nano-ribbon.

The semiconductor layer is formed on the source/drain electrodes by spin coating, spraying, inkjet printing, flexography, screening, dip coating, gravure printing, etc. This method enables it to form patterns on the electrodes or in a local region of the substrate and to perform a thermal treatment or exposure after formation of the organic semiconductor layer in order to enhance the performance of the device, including semiconductor crystallinity, stability, etc.

Subsequently, the present invention may form a dopant layer selectively in a part of the region where the organic semiconductor layer is disposed, in the step of forming a dopant layer.

Forming a dopant layer means that the solvent containing a dopant dissolves the semiconductor layer to turn the region making up a part of the semiconductor layer into a dopant layer.

At this point, the inkjet printing method is used to form a dopant layer on a part of the semiconductor layer.

It is a conventional technique to form a device, such as an electrode, a semiconductor layer, etc., by inkjet printing. Yet, the present invention employs an inkjet printing method using a solvent as ink to form a dopant layer in the dopant formation process that is removing an unnecessary portion.

The present invention uses the inkjet printing method to form a dopant layer in a local region. That is, the formation of a dopant layer can be performed locally in the region as possible as the current inkjet printing technique allows. Hence, the dopant layer can be formed in a region that is from about 1 μm up to a desired size, preferably 1 μm to 10 mm in diameter. It is technically difficult to use other printing methods than the inkjet printing technique in order to selectively form a dopant layer on the semiconductor layer.

In the present invention, the substance available as a dopant may be an n type dopant or a p type dopant.

Examples of the n type dopant as used herein may include cesium fluoride (CsF), bis(ethylenedithio)-tetrathiafulvalence (BEDT-TTF), tetrathianaphthacene (TTN), bis(cyclopentadienyl)-cobalt(II) (CoCp$_2$), chromium with the anion of 1,3,4,6,7,8-hexahydro-2H-pyrimido[1,2-a]pyrimidine (hpp) (Cr$_2$(hpp)$_4$), tungsten with the anion of 1,3,4,6,7,8-hexahydro-2H-pyrimido[1,2-a]pyrimidine (hpp) (W$_2$(hpp)$_4$), pyronin B chloride, acridine orange base [3,6-bis(dimethylamino)acridine (AOB)], leuco bases like leuco crystal violet (LCV), (4-(1,3-dimethyl-2,3-dihydro-1H-benzoimidazol-2yl)phenyl)dimethylamine (nDMBI), 2-(2-methoxyphenyl)-1,3-dimethyl-1H-benzoimidazol-3-ium iodide (o-MeO-DMBI-I), etc.

Examples of the p type dopant as used herein may include 2,3,5,6-tetrafluoro-7,7,8,8-tetracyanoquinodimethane ($F_4$-TCNQ), 3,6-difluoro-2,5,7,7,8,8-hexacyanoquinodimethane ($F_2$—HCNQ), molybdenum trioxide ($MoO_3$), tungsten trioxide ($WO_3$), etc.

On the other hand, it is necessary to use a solvent that dissolves a dopant in order to print the dopant by the inkjet printing technique. The preferred solvent is the one that dissolves all of the dopant and part of the semiconductor layer.

Examples of the solvent as used herein may include chlorobenzene, chloroform, trichlorobenzene, tetrahydrofuran, dichlorobenzene, and dichloroethane.

Preferably, the mixing ratio of the dopant to the solvent in the inkjet printing method ranges from 0.5 mg/ml to 1.5 mg/ml.

When the mixing ratio of the dopant to the solvent with respect to the semiconductor is less than 0.5 mg/ml, an effective doping is impossible to achieve, resulting in insignificant or little change in the performance of the device. When the mixing ratio of the dopant to the solvent is greater than 1.5 mg/ml, it makes an adverse effect on the crystallinity of the semiconductor film to deteriorate the performance of the device or excessively raise the conductivity, causing a malfunction of the transistor.

Referring to FIG. 2, in the fabrication of a CMOS inverter device, a semiconductor layer is formed on the electrodes, and a dopant layer is formed on a part of the semiconductor layer, that is, on the semiconductor layer in two regions between the source/drain electrodes. As illustrated in FIG. 2, an n type dopant is printed on the semiconductor layer in the one region between the source/drain electrodes, whereas a p type dopant is printed on the semiconductor layer in the other region between the source/drain electrodes. In this regard, it is preferable to print a solvent capable of dissolving the dopant on the semiconductor layer so that a part of the semiconductor layer is dissolved in the solvent and mixed with the dopant contained in the solvent.

In the part of the semiconductor layer containing the dopant, the amount of the dopant is preferably in the range of 0.5 wt. % to 1.0 wt. %.

In the part of the semiconductor layer containing the dopant, the quantity of the dopant is preferably in the range of 0.5 wt. % to 1.0 wt. %.

The quantity of the dopant ranging from 0.5 wt. % to 1.0 wt. % secures high performance of the device, that is, high conductivity without adversely affecting the crystallinity of the semiconductor film.

Figure 3:
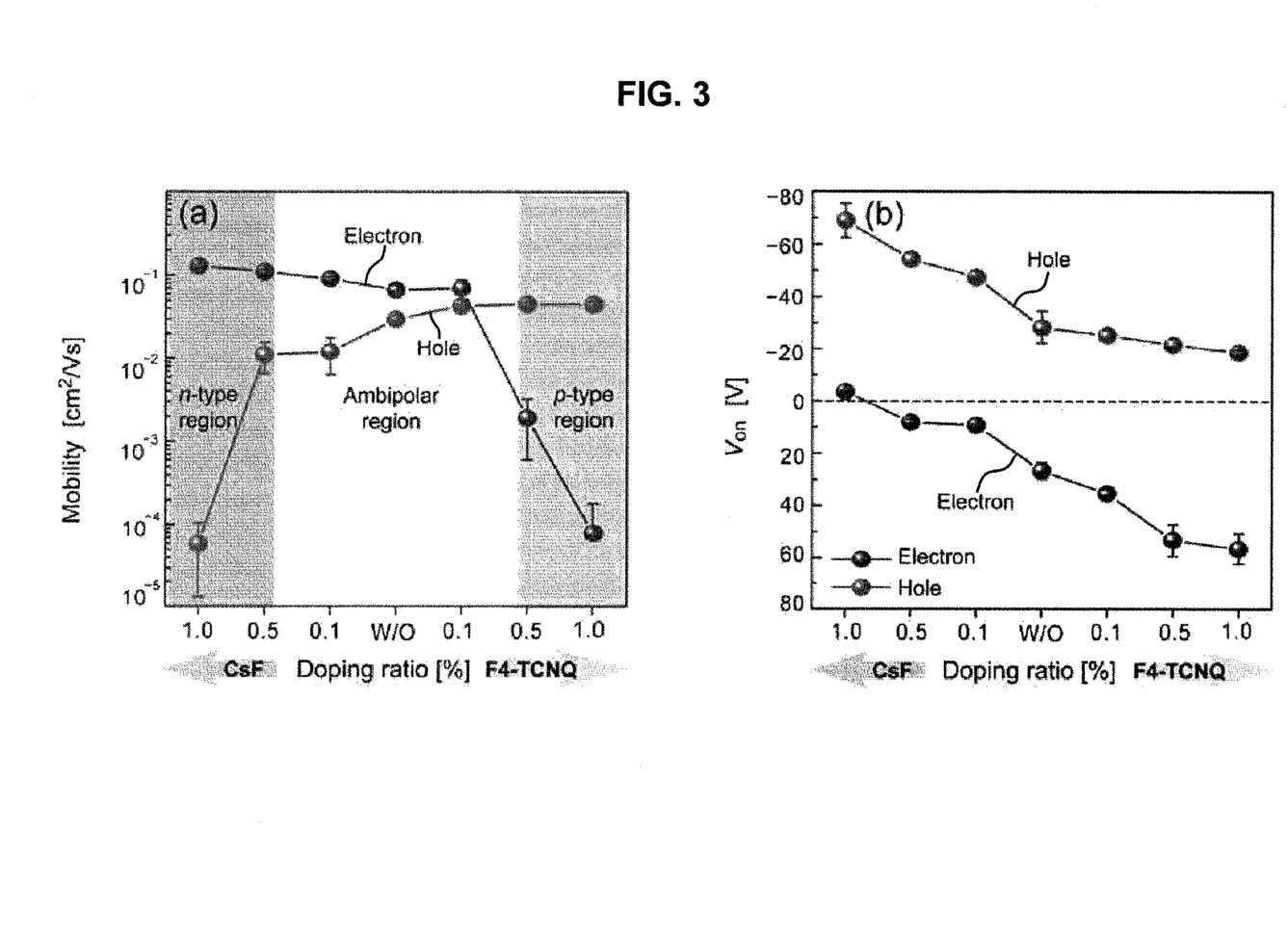
FIG. 3 shows the charge mobility behavior and voltage change depending on the quantity of the dopant contained in the semiconductor layer.

FIG. 3 shows the mobility behavior and the voltage change as a function of the quantity of the dopant in the semiconductor layer.

In FIG. 3, the graph (a) shows the charge mobility behavior of electrons and holes changed due to the n- and p-type doping, and the graph (b) shows the change of the start voltage Von resulting from the change of the charge mobility.

As can be seen from the graph (a) of FIG. 3, when undoped, the device shows the bidirectional transport characteristics that charges and holes have a similar mobility. Yet, when n type doped, n type characteristics increase, whereas p type characteristics decrease, so that the device exhibits characteristics of an n type transistor. When p type doped, p type characteristics increase, whereas n type characteristics decrease, ending up with the device showing characteristics of a p type transistor.

As can be seen from the graph (b) of FIG. 3, the start voltage of the transistor can be controlled due to the doping. The start voltage of the n type transistor lowers with an increase in the quantity of the n type dopant, while the start voltage of the p type transistor reduces with an increase in the amount of the p type dopant. That is, it is possible to change the performance of the transistor in a desired direction by adjusting the type and quantity of the dopant.

An insulating layer may be formed on the whole surface of the organic semiconductor layer on which the dopant layer is printed, in the step of forming an insulating layer.

The insulating layer may comprise a single layer or a multi-layer of an organic or inorganic insulating layer; or an organic-inorganic hybrid layer. The organic insulating layer may use at least one selected from the group consisting of polymethylmethacrylate (PMMA), polystyrene (PS), phenol-based polymer, acryl-based polymer, imide-based polymer like polyimide, arylether-based polymer, amide-based polymer, fluorine-based polymer, p-xylene-based polymer, vinylalcohol-based polymer, and perylene. The inorganic insulating layer may use at least one selected from the group consisting of silicon oxide, silicon nitride, $Al_2O_3$, $Ta_2O_5$, BST, and PZT.

On a part of the region of the insulating layer may be formed a gate electrode, in the step of forming a gate electrode.

The gate electrode may comprise any one selected from the group consisting of aluminum (Al), Al-alloy, molybdenium (Mo), Mo-alloy, silver nanowire, gallium indium eutectic, and PEDOT:PSS. The gate electrode may be prepared through the printing process, such as ink-jet printing or spraying, using the above-mentioned substances as ink. Using the printing process to form the gate electrode can exclude the vacuuming process and thus reduce the production cost.

In this manner, the transistor according to one embodiment of the present invention is completed.

Figure 4:
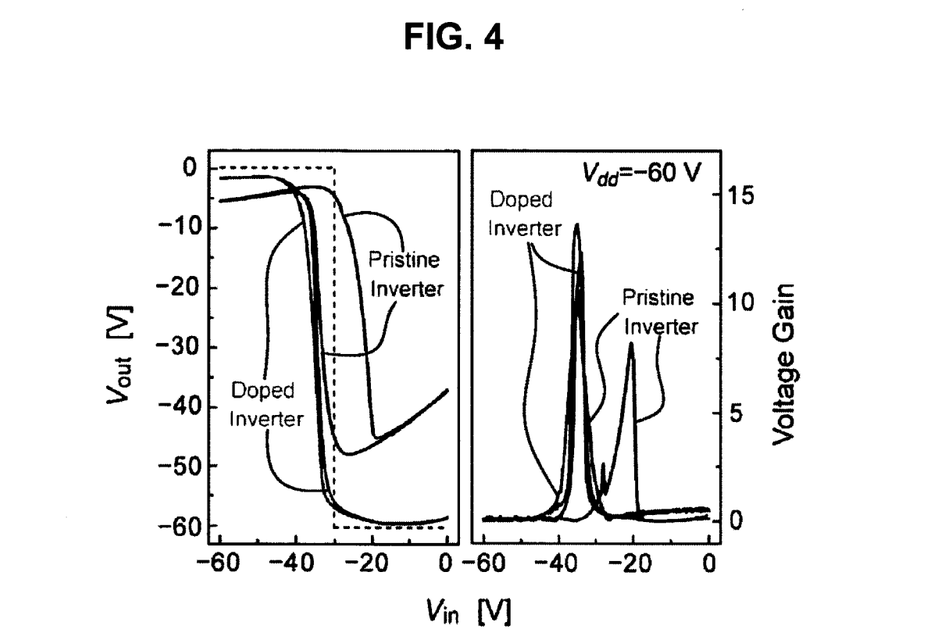
FIG. 4 presents graphs drawing a comparison of performance between a CMOS inverter manufactured according to one embodiment of the present invention and a CMOS inverter manufactured without printing a dopant.

FIG. 4 presents graphs drawing a comparison of performance between a CMOS inverter manufactured according to one embodiment of the present invention and a CMOS inverter manufactured without printing a dopant.

FIG. 4 shows the voltage-transfer characteristic (left side) and the voltage gain characteristic (right side) of a CMOS inverter. The graph in orange is for the undoped, pristine device, where the voltage loss is at least 5 V and 20 V when Vin=−60 V and 0 V, respectively. This results in great power loss [P (power loss)=V (voltage)*I (current)] and low noise margin. The device also exhibits a high degree of hysteresis. Such a device, when used in the actual circuitry, possibly causes problems in regards to the stability.

On the contrary, the graph in blue is for the device of the present invention doped by inkjet printing. Unlike the graph of the undoped inverter, the graph shows the voltage loss almost as low as zero when Vin=−60 V or 0 V, that is, good inverter characteristics without hysteresis. Besides, the doped inverter exhibits a higher voltage gain characteristic of about 14 than the undoped inverter.

MODES FOR CARRYING OUT THE INVENTION

Hereinafter, a detailed description will be given as to specific embodiments of the present invention.

Example 1

Preparation of Substrate and Formation of Electrodes

In the manufacture of a transistor, a substrate is prepared and source/drain electrodes are formed on the substrate.

Formation of Semiconductor Layer

An organic semiconductor, PCBM, is used to form an organic semiconductor layer. In the formation of the organic semiconductor layer, the semiconductor layer is formed to cover both the source and drain electrodes.

Formation of Dopant Layer

In order to form a dopant layer, an n type dopant is mixed with chlorobenzene prepared as a solvent to prepare an n type dopant solution. The n type dopant is cesium fluoride (CsF), and the concentration of the dopant is 1 mg/ml in the solution.

The dopant solution is printed on the semiconductor layer by inkjet printing so that a dopant layer is formed using an n type dopant, CsF, on the semiconductor layer in the region between the source and drain electrodes. The inkjet printing is performed to print a dopant layer as large as about 50 μm in diameter.

The dopant layer is formed so that the quantity of the dopant injected into the semiconductor layer amounts to 1.0 wt. %. The quantity of the dopant can be controlled by adjusting the amount of the solution injected by the inkjet printing method.

Formation of Insulating Layer

Spin coating is performed using polystyrene (PS) to form an insulating layer on the substrate including the organic semiconductor layer.

Formation of Gate Electrode

A gate electrode is formed on a part region of the insulating layer. This process can be performed by deposition of aluminum Al.

In this manner, a transistor is fabricated.

Examples 2 and 3

The procedures are performed in the same manner as described in Example 1, excepting that the quantity of the n type dopant, CsF, of the semiconductor layer as used in the step of forming a dopant layer is 0.5 wt. % (Example 2) or 0.1 wt. % (Example 3).

Example 4

The procedures are performed to manufacture a transistor in the same manner as described in Example 1, excepting that a p type dopant, $F_4$-TCNQ, is used to form a dopant layer on the semiconductor layer in a region between the source and drain electrodes, where the quantity of the dopant injected into the semiconductor layer is 1.0 wt. %.

Examples 5 and 6

The procedures are performed in the same manner as described in Example 4, excepting that the quantity of the p type dopant, $F_4$-TCNQ, of the semiconductor layer as used in the step of forming a dopant layer is 0.5 wt. % (Example 5) or 0.1 wt. % (Example 6).

Comparative Example 1

The procedures are performed in the same manner as described in Example 1, excepting that a thin film transistor is manufactured without forming a dopant layer using the inkjet printing method.

Figure 5:
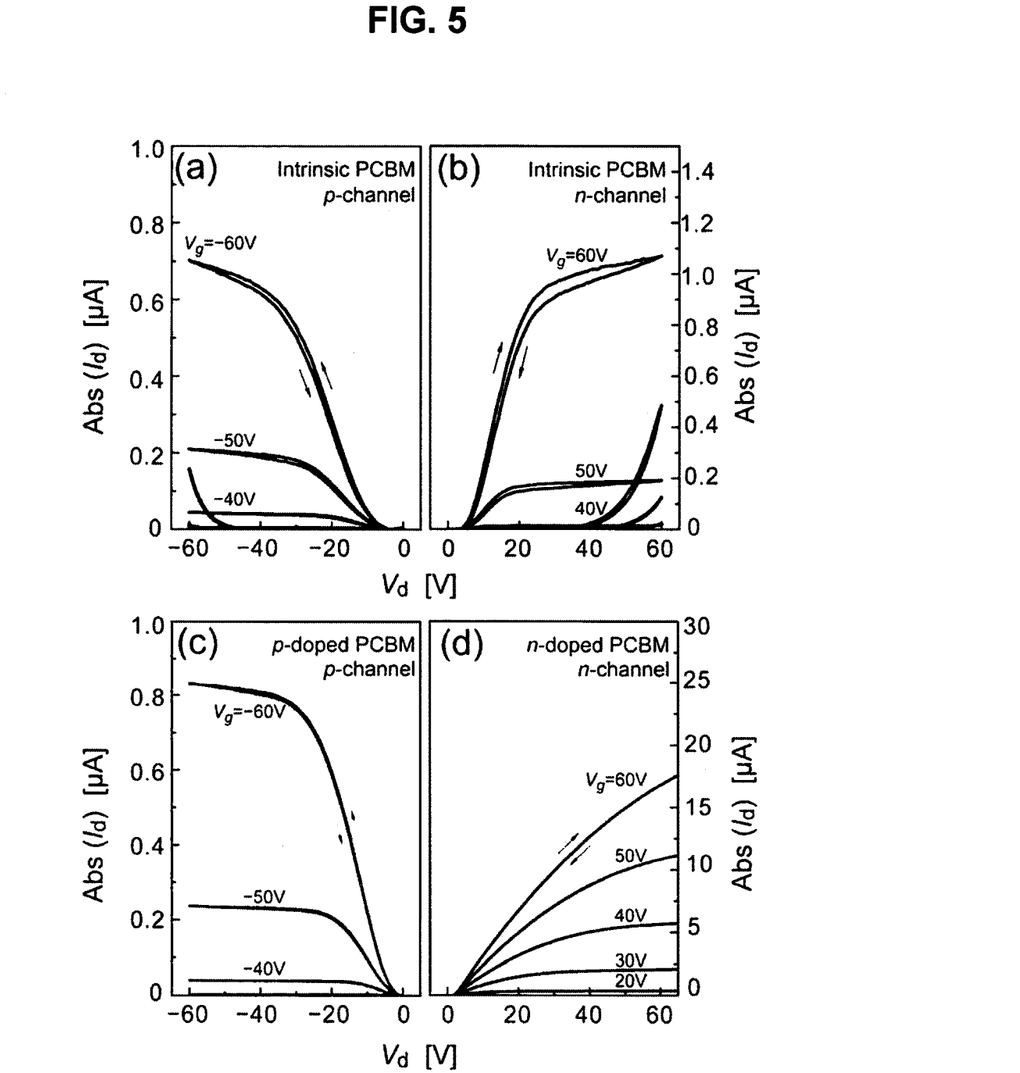
FIG. 5 shows the performance of n and p channels in the transistors of Examples 1 and 4 and Comparative Example 1.

FIG. 5 shows the performance of n and p channels in the transistors of Examples 1 and 4 and Comparative Example 1.

In FIG. 5, the graphs (a) and (b) present the n type and p type output characteristics of an organic thin film transistor before addition of a dopant; the graph (c) shows the p type output characteristic of a transistor with 1.0 wt. % of a p type dopant added; the graph (d) shows the n type output characteristic of a transistor with 1.0 wt. % of an n type dopant added. As can be seen from the graphs (a) and (b), when the drain voltage Vd of the undoped transistor is low, the current increases in an S-shaped curve rather than a linear curve. This is an undesirable phenomenon that occurs due to high contact resistance between the electrodes and the semiconductor. Contrarily, in the graphs (c) and (d) of the doped transistor, the current in a linear curve at low drain voltage Vd, more current flowing than in the undoped transistor. This shows that the doping improves the contact resistance considerably and increases the quantity of charges in the semiconductor, leading to the device with enhanced performance.

Figure 6:
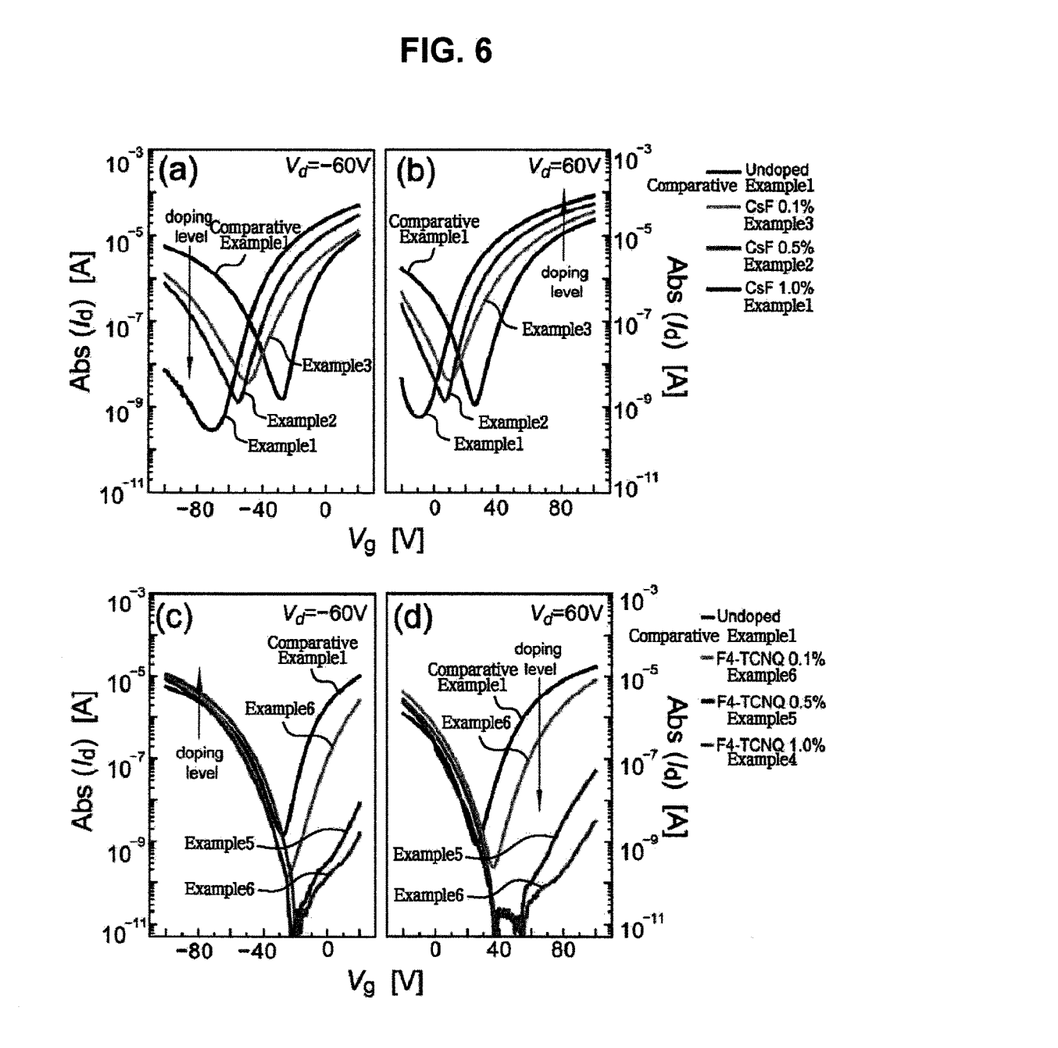
FIG. 6 shows the performance of the transistors of Examples 1 to 6 and Comparative Example 1.

FIG. 6 shows the performance of the transistors of Examples 1 to 6 and Comparative Example 1.

The graphs of FIG. 6 compare the transfer characteristic performance of the transistors according to Examples 1 to 6 and Comparative Example 1. In FIG. 6, the graph (a) shows the p type characteristic of the transistors with an n type dopant in Examples 1, 2 and 3; the graph (b) shows the n type characteristic of the transistors with an n type dopant in Examples 1, 2 and 3; the graph (c) shows the p type characteristic of the transistors with a p type dopant in Examples 4, 5 and 6; and the graph (d) shows the n type characteristic of the transistors with a p type dopant in Examples 4, 5 and 6.

As can be seen from the graphs (a) and (b) of FIG. 6, an increase in the quantity of the n type dopant leads to a gradual decrease of the current in the p type characteristic and a gradual increase of the current in the n type characteristic. As can be seen from the graphs (c) and (d) of FIG. 6, with an increase in the quantity of the p type dopant, the current in the p type characteristic a little bit increases and the current in the n type characteristic decreases greatly. That is, the n type characteristic gets better with an increase in the quantity of the n type dopant, and the p type characteristic gets better with an increase in the quantity of the p type dopant.

Example 7

13 nm/2 nm-thick Au/Ni source and drain electrodes are patterned on a Corning™ Eagle 2000 glass substrate by a general photolithography process. Prior to the fabrication of an OTFT, the substrate is immersed in the solvents of distilled water, acetone and isopropyl alcohol in sequential order and then washed in an ultra-sonification bath for 10 minutes. The substrate is sufficiently dried out through nitrogen gas to completely eliminate the remaining solvent and then surface-washed again with UV/$O_3$ equipment.

A semiconductor ink that is prepared by dissolving 10 mg/mL of P(NDI$_2$OD-T$_2$) (Polyera Inc.) (Chemical Formula 1) in a solvent of chlorobenzene is applied by spin coating to form a film on the substrate on which the source and drain electrodes are formed. For the preparation of the dopant ink, an organic compound of bis(cyclopentadienyl)-cobalt(II) (cobaltocene, CoCp$_2$) (Sigma-Aldrich Inc.) (Chemical Formula 2) as a dopant is dissolved in a 1:1 mixed solvent of 2-ethoxyethanol and chlorobenzene.

P(NDI2OD-T2)

[Chemical Formula 2]

CoCp2

For the sake of inkjet doping, the dopant ink thus prepared is applied selectively to a channel region of the substrate including the semiconductor film with an inkjet printer. The selectively doped semiconductor film is subjected to a thermal treatment at 150° C. for 20 minutes. Finally, a PMMA (Sigma-Aldrich Inc.) insulator is applied to a thickness of 500 nm by spin coating, and an Al electrode is formed as thick as 50 nm using thermal deposition equipment to complete a top gate type OTFT.

Comparative Example 2

The procedures are performed in the same manner as described in Example 7, excepting that an OTFT having the same structure of Example 7 is manufactured without inkjet doping.

Figure 7:
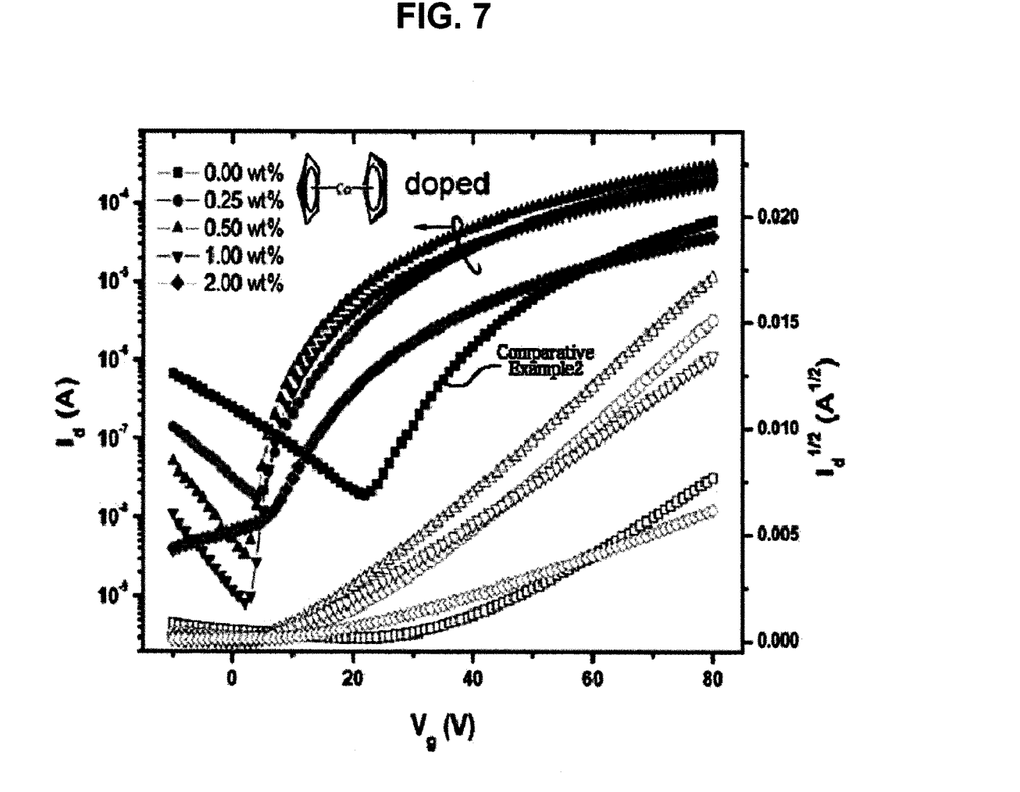
FIG. 7 presents current-voltage transition curves of the P(NDI2OD-T2) OTFTs manufactured according to Example 7 and Comparative Example 2.

FIG. 7 presents current-voltage transition curves of the P(NDI2OD-T2) OTFTs manufactured according to Example 7 and Comparative Example 2. It can be seen that the drain current is greatly enhanced when the undoped device of Comparative Example 2 is doped with a dopant of different concentrations. According to the experimental results, the undoped device of Comparative Example 2 has a charge mobility of 0.35 $cm^2Ns$, whereas the optimized, doped device is enhanced in performance to have a charge mobility of 0.72 $cm^2Ns$, which is higher about twice or more than the undoped device. Further, the doped device also exhibits a remarkable enhancement of the operational stability against the voltage.

Figure 8:
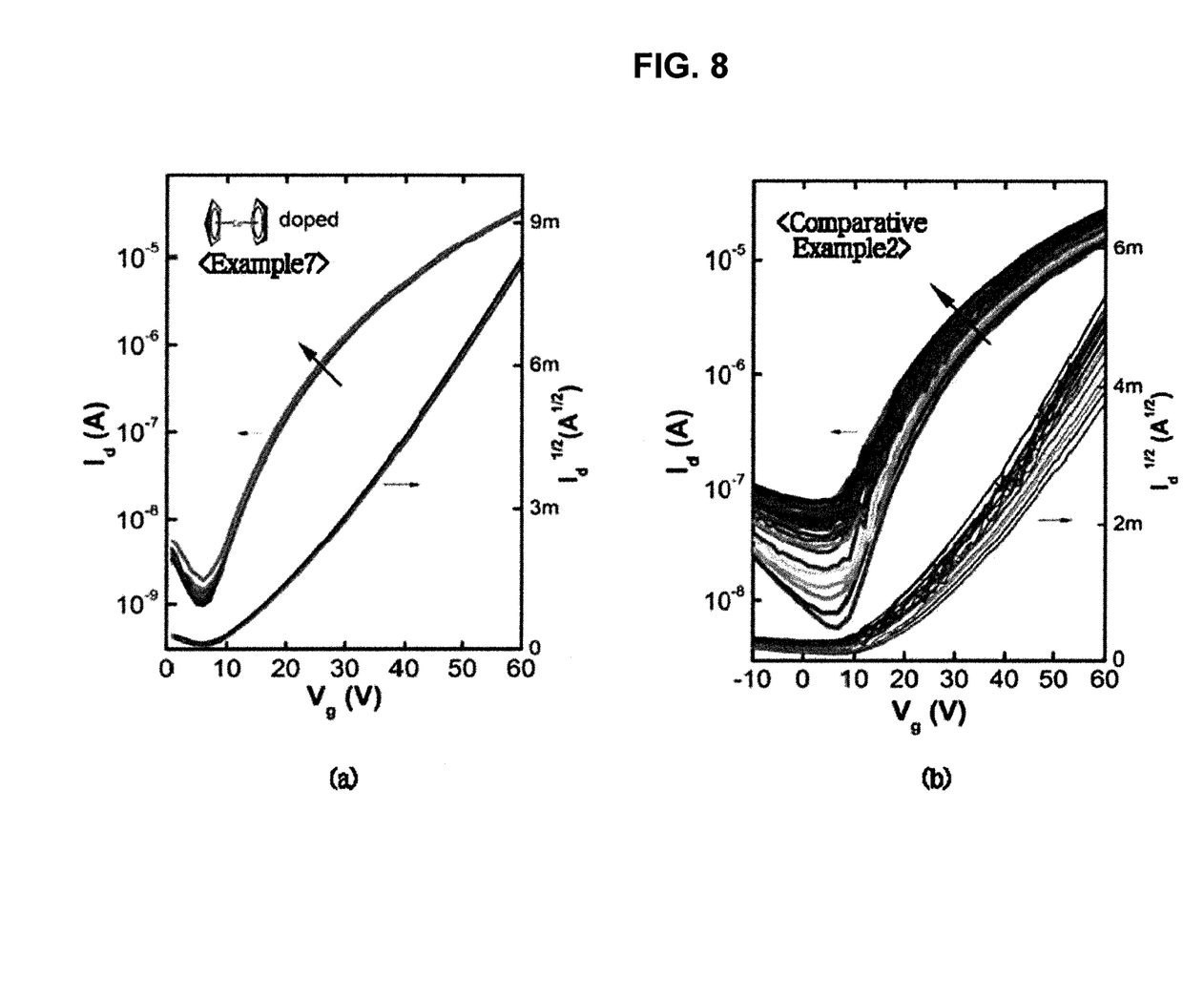
FIG. 8 presents transition curves showing the stability of the devices according to Example 7 and Comparative Example 2.

FIG. 8 presents transition curves showing the stability of the devices according to Example 7 and Comparative Example 2.

In FIG. 8, the graph (a) is the transition curve of the doped device according to Example 7, and the graph (b) is the transition curve of the undoped device of Comparative Example 2.

The undoped device of Comparative Example 2 is under stress from the continuous operations, which changes the transition curve towards the lower level of the threshold voltage. Yet, the doped device of Example 7 forms a constant transition curve without a change against long-term operations. This shows that the present invention is under nearly no stress from the long-term continuous operations.

The foregoing description of the invention has been presented for purposes of illustration and description and is not intended to be exhaustive or to limit the invention to the precise form disclosed, and obviously many modifications and variations are possible in light of the above teaching.

What is claimed is:

1. A method for manufacturing a transistor according to selective printing of a dopant, the method comprising:
   forming a semiconductor layer on a substrate for manufacture of a transistor; and
   forming a dopant layer on the semiconductor layer,
   wherein the formation of the dopant layer includes selectively printing an n type dopant or a p type dopant by inkjet printing,
   wherein a solvent containing the dopant dissolves a predetermined portion of the semiconductor layer and the dopant becomes a part of the semiconductor layer,
   wherein the n type dopant comprises at least one selected from the group consisting of bis(ethylenedithio)-tetrathiafulvalence (BERT-TTF), tetrathianaphthacene (TTN), bis(cyclopentadienyl)-cobalt(II) ($CoCp_2$), chromium with the anion of 1,3,4,6,7,8-hexahydro-2H-pyrimidof1,2-alpyrimidine (hpp) ($Cr_7(hpp)_4$), tungsten with the anion of 1,3,4,6,7,8-hexahydro-2H-pyrimidol1,2-alpyrimidine (hpp) ($W_2(hpp)_4$), pyronin B chloride, acridine orange base [3,6-bis(dimethylamino)acridine (AOB)], leuco bases like leuco crystal violet (LCV), (4-(1,3-dimethyl-2,3-dihydro-1H-benzoimidazol-2yl)phenyl)dimethylamine (nDMBI), and 2-(2-methoxyphenyl)-1,3-dimethyl-1H-benzoimidazol-3-ium iodide (o-MeO-DMBI-I),
   wherein the p type dopant comprises at least one selected from the group consisting of 3,6-difluoro-2,5,7,7,8,8-hexacvanoquinodimethane ($F_2$-HCNQ), molybdenum trioxide ($MoO_3$) and tungsten trioxide ($WO_3$),
   wherein the n type dopant or the p type dopant is dissolved in the solvent and used in inkjet printing,
   wherein the solvent comprises any one selected from the group consisting of chlorobenzene, chloroform, trichlorobenzene, tetrahydrofuran, dichlorobenzene, and dichloroethane, and
   wherein the amount of the dopant contained in a portion of the semiconductor layer containing the dopant is 0.5 wt. % to 1.0 wt. %.

2. A method for manufacturing a transistor, comprising:
   preparing a substrate;
   forming a source/drain electrode on the substrate;
   forming a semiconductor layer on the source/drain electrode;
   forming a dopant layer on the semiconductor layer;
   forming an insulating layer on the semiconductor layer; and
   forming a gate electrode on the insulating, layer,
   wherein the formation of the dopant layer is performed by selectively printing a dopant layer on the semiconductor layer by inkjet printing,
   wherein a solvent containing the dopant dissolves a redetermined portion of the semiconductor layer and the dopant becomes a part of the semiconductor layer,
   wherein the n type dopant comprises at least one selected from the group consisting of bis(ethylenedithio)-tetrathiafulvalence (BEDT-TTF), tetrathianaphthacene (TTN), bis(cyclopentadienyl)-cobalt(II) ($CoCp_2$), chromium with the anion of 1,3,4,6,7,8-hexahydro-2H-pyrimido[1,2-a]pyrimidine (hpp) ($Cr_2(hpp)_4$), tungsten with the anion of 1,3,4,6,7,8-hexahydro-2H-pyrimido[1,2-a]pyrimidine (hpp) ($W_2(hpp)_4$), pyronin B chloride, acridine orange base [3,6-bis(dimethylamino) acridine (AOB)], leuco bases like leuco crystal violet (LCV), (4-(1,3-dimethyl-2,3-dihydro-1H-benzoimidazol-2yl)phenyl)dimethylamine (nDMBI), and 2-(2-methoxyphenyl)-1,3-dimethyl-1H-benzoimidazol-3-ium iodide (o-MeO-DMBI-1), wherein the p type dopant comprises at least one selected from the group consisting of 3,6-difluoro-2,5,7,7,8,8-hexacyanoquinodimethane ($F_2$-HCNQ), molybdenum trioxide ($MoO_3$), and tungsten trioxide ($WO_3$), wherein the n type dopant or the p type dopant is dissolved in the solvent and used in inkjet printing, wherein the solvent comprises any one selected from the group consisting of chlorobenzene, chloroform, trichlorobenzene, tetrahydrofuran, dichlorobenzene, and dichloroethane, and wherein the amount of the dopant contained in a portion of the semiconductor layer containing the dopant is 0.5 wt. % to 1.0 wt. %.

3. The method as claimed in claim 2, wherein the semiconductor layer comprises any one selected from the group consisting of an organic semiconductor, a metal oxide semiconductor and a carbon compound semiconductor.

4. The method as claimed in claim 3, wherein the organic semiconductor comprises any one selected from the group consisting of an amphiphillic organic semiconductor, an n type organic semiconductor and a p type organic semiconductor, wherein the amphiphillic organic semiconductor is any one selected from the group consisting of [6,6-phenyl-$C_{61}$-butyric acid methyl ester (PCBM), naphthalene-bis(dicarboximide)bithiophene (P(NDI$_2$OD-T$_2$)), poly [(9,9-di-n-octylfluorenyl-2,7-diyl)-alt-(benzo[2,1,3] thiadiazol-4,8-diyl)] ($F_8$BT), poly(9,9-dioctylfluorene) (PFO), diketopyrrolo-pyrrole-bithiophene (DPPT-TT), and poly(thienylenevinylene-cophthalimide) (PTVPhI-Eh) functionalized with dodecyl at the imide nitrogen, wherein the n type organic semiconductor is any one selected from a substance based on acene, fully fluorinated acene, partially fluorinated acene, partially fluorinated oligothiophene, fullerene, fullerne with a substituent, fully fluorinated phthalocyanine, partially fluorinated phthalocyanine, perylene tetracarboxylic diimide, perylene tetracarboxylic dianhydride, naphthalene tetracarboxylic diimide, or naphthalene tetracarboxylic dianhydride, or a derivative thereof, wherein the P type organic semiconductor is any one selected from a substance including acene, poly-thienylene vinylene, poly-3-hexylthiophene, alpha-hexathienylene, naphthalene, alpha-6-thiophene, alpha-4-thiophene, rubrene, polythiophene, polyparaphenylene vinylene, polyparaphenylene, polyfluorene, polythiophene vinylene, polythiophene-heterocyclic aromatic copolymer, or triaryl amine, or a derivative thereof.

5. The method as claimed in claim 3, wherein the metal oxide semiconductor is any one selected from the group consisting of zinc oxide ($ZnO_x$), indium oxide ($InO_x$), indium gallium zinc oxide (IGZO), and indium tin oxide (ITO).

6. The method as claimed in claim 3, wherein the carbon compound semiconductor is selected from carbon nanotube (CNT) or graphene nano-ribbon.

* * * * *